United States Patent
Freundlich et al.

(10) Patent No.: US 9,450,123 B2
(45) Date of Patent: Sep. 20, 2016

(54) THERMO-TUNNELING DESIGN FOR QUANTUM WELL PHOTOVOLTAIC CONVERTER

(71) Applicant: The University of Houston System, Houston, TX (US)

(72) Inventors: Alexandre Freundlich, Houston, TX (US); Andenet Alemu, Houston, TX (US)

(73) Assignee: The University of Houston System, Houston, TX (US)

( * ) Notice: Subject to any disclaimer, the term of this patent is extended or adjusted under 35 U.S.C. 154(b) by 0 days.

(21) Appl. No.: 13/740,726

(22) Filed: Jan. 14, 2013

(65) Prior Publication Data

US 2013/0186458 A1    Jul. 25, 2013

Related U.S. Application Data

(60) Provisional application No. 61/586,020, filed on Jan. 12, 2012.

(51) Int. Cl.
| | |
|---|---|
| *H01L 31/00* | (2006.01) |
| *H01L 31/0352* | (2006.01) |
| *H01L 31/0304* | (2006.01) |

(Continued)

(52) U.S. Cl.
CPC . *H01L 31/035236* (2013.01); *H01L 31/03048* (2013.01); *H01L 31/077* (2013.01); *B82Y 20/00* (2013.01); *Y02E 10/544* (2013.01); *Y10S 977/755* (2013.01)

(58) Field of Classification Search
CPC ............... H01L 31/035236; H01L 31/03048; H01L 31/077; Y02E 10/544; Y10S 977/755; B82Y 20/00
See application file for complete search history.

(56) References Cited

U.S. PATENT DOCUMENTS

| | | | |
|---|---|---|---|
| 4,688,068 A * | 8/1987 | Chaffin et al. | 136/249 |
| 4,903,101 A * | 2/1990 | Maserjian | B82Y 20/00 250/370.14 |
| 6,372,980 B1 * | 4/2002 | Freundlich | 136/255 |

FOREIGN PATENT DOCUMENTS

| | | | | |
|---|---|---|---|---|
| GB | WO20122029850 | * | 8/2011 | 136/255 |

OTHER PUBLICATIONS

Raisky et al , Jan. 1999, "Resonant enhancement of the photocurrent in multiplequantum well photovoltaic device".*

(Continued)

*Primary Examiner* — Tamir Ayad
*Assistant Examiner* — Uyen Tran
(74) *Attorney, Agent, or Firm* — Jackson Walker L.L.P.

(57) ABSTRACT

A design of a quantum well region that allows faster and more efficient carrier collection in quantum well solar cells. It is shown that for a quantum well material system displaying a negligible valence band offset, the conduction band confinement energies and barrier thicknesses can be designed to favor a sequential thermionic promotion and resonant tunneling of electrons to the conduction band continuum resulting in faster carrier collection rates than for a conventional design. An evaluation of the proposed design in the context of devices incorporating GaAs/GaAsN quantum wells shows a collection of all photo-generated carriers within several to tenths of ps ($10^{-12}$ s) from deep quantum wells rather than several ns, as it is the case for conventional designs. The incorporation of the proposed design in single and multijunction solar cells is evaluated with efficiency enhancements.

17 Claims, 11 Drawing Sheets

(51) Int. Cl.
*H01L 31/077* (2012.01)
*B82Y 20/00* (2011.01)

(56) References Cited

OTHER PUBLICATIONS

A. Alemu and A. Freundlich, "Opportunities in dilute nitride III-V semiconductors quantum confined p—i—n solar cells for single carrier resonant tunneling", Microelectron. J., vol. 40, Issue 3, 421-423 (2009).
L. Bhusal, A. Freundlich "Band structure and absorption properties of GaAs1-xNx/InAs1-yNy short period superlattices strained to InP (001)", Phys. Rev. B 75, 075321 (2007).
L. Bhusal, A. Alemu, A. Freundlich, "Band alignments and quantum confinement in (111) GaAsN/InAs strain-balanced nanostructures", Nanotechnology 15, S245-S249 (2004).
L. Bhusal, A. Alemu, A. Freundlich "Short-period strain-balanced GaAs1-xNx/InAs1-xNx superlattices lattice matched to InP(001): A material for 0.4-0.6 eV mid infrared applications", Phys Rev B, 72, 073309 (2005).
K. W. J. Barnham and G. Duggan, "A new approach to high-efficiency multi-band-gap solar cells", J. Appl. Phys. 67, 7, 3490-3493 (1990).
J.A.H. Coaquira, M.-A. Pinault, A.P. Litvinchuk, L. Bhusal and A. Freundlich, "Near band-edge luminescence and evidence of the weakening of the N coupling for high nitrogen composition in GaAs1-xNx diluted nitride epilayers." J. Appl. Phys. 102, 073716 (2007).
Fox A. M., Miller D. A. B., Livescu G., Cunningham J. E. and Jan W. Y., "Quantum well carrier sweep out: relation to electroabsorption and exciton saturation", IEEE Journal of Quantum Electronics, 27, 2281 (1991).
A. Freundlich, A. Fotkatzikis, L. Bhusal, L. Williams, A. Alemu, W. Zhu, J. A. H. Coaquira, A. Feltrin, and G. Radhakrishnan, "Chemical beam epitaxy of GaAsN/GaAs multiquantum well solar cell", J. Vac. Sci. Technol. B 25, 987 (2007).
A. Freundlich, A. Fotkatzikis, L. Bhusal, L. Williams, A. Alemu, W. Zhu, J.A.H. Coaquira, A. Feltrin and G. Radhakrishnan, "III-V dilute nitride-based multi-quantum well solar cell", Journal of Crystal Growth, vols. 301-302, pp. 993-996 (2007).

A. Freundlich and A. Alemu, "Multi quantum well multijunction solar cell for space applications", physica status solidi (c), vol. 2 (8), pp. 2978-2981 (2005).
S. R. Kurtz, A. A. Allerman, E. D. Jones, J. M. Gee, J. J. Banas, "InGaAsN solar cells with 1.0 eV band gap, lattice matched to GaAs", Appl. Phys. Lett., vol. 74, pp. 729-731 (1999).
Larsson A., Andrekson P. A., Eng S. T. and Yariv A., "Tunable superlattice p—i—n photodetectors: characteristics, theory, and application", IEEE Journal of Quantum Electronics, 24, 787 (1988).
C. Monier, MF Vilela, I. Serdiukova, and A. Freundlich "Photocurrent and photoluminescence spectroscopy of InAsxP1-x/InP strained quantum wells grown by chemical beam epitaxy", J. Cryst. Growth, 188 pp. 332-337 (1998).
W. Shan, W. Walukiewicz, and J. W. Ager, III, "Band Anticrossing in GaInNAs Alloys", Phys. Rev. Lett. 82, 1221-1224 (1999).
Raisky O. Y., Wang W. B., Alfano R. R., Reynolds C. L., Jr. and Swaminathana V., "Investigation of photoluminescence and photocurrent in InGaAsP/InP strained multiple quantum well heterostructures", J. Appl. Phys. 81, 394 (1997).
W. Shockley and H. J. Queisser, "Detailed Balance Limit of Efficiency of p—n Junction Solar Cells", J. Appl. Phys., 32 , pp. 510-519 (1961).
S. Turcotte, J.-N. Beaudry, R. A. Masut, P. Desjardins, G. Bentoumi, and R. Leonelli, "Experimental investigation of the variation of the absorption coefficient with nitrogen content in GaAsN and GaInAsN grown on GaAs (001)", J. Appl. Phys., 104, 083511 (2008).
G. K. Vijaya, A. Alemu, and A. Freundlich, "Modeling of 1 ev dilute nitride multi-quantum well solar cell", Proceedings of the 35th IEEE Photovoltaic Specialists Conference, Honolulu, Hawaii (2010) pp. 380-384.
G. Wei K. T Shiu, N. C. Giebink and S. R. Forresta, "Thermodynamic limits of quantum photovoltaic cell efficiency", Appl. Phys. Lett. 91, 223507 (2007).
M. Weyers and M. Sato, "Growth of GaAsN alloys by low-pressure metalorganic chemical vapor deposition using plasma-cracked NH3", Appl. Phys. Lett. 62 (12), pp. 1396 (1993).
Schneider H. and Klitzing K. v., "Thermionic emission and Gaussian transport of holes in a GaAs/AlxGa1-xAs multiple-quantum-well structure", Phys. Rev. B 38, 6160 (1988).

\* cited by examiner nth period of the MQW stack

FIG. 11

| Step | Quantum wells involved | Initial level | Transition type and characteristic time | Final level |
|---|---|---|---|---|
| 1 | 30 ML GaAsN/GaAs | $E_{e1-hh}$ = 1.14 eV | Thermionic: $\tau_{th}$=1.1x10$^{-12}$ s | $E_{e2-hh}$ = 1.19 eV |
| 2 | 30 ML GaAs$_{0.982}$N$_{0.018}$/GaAs to 12 ML GaAs$_{0.982}$N$_{0.018}$/GaAs | $E_{e2-hh}$ = 1.19 eV | Tunneling: $\tau_t$=3.7x10$^{-14}$ s | $E_{e1-hh}$ = 1.19 eV |
| 3 | 12 ML GaAs$_{0.982}$N$_{0.018}$/GaAs | $E_{e1-hh}$ = 1.19 eV | Thermionic: $\tau_{th}$=4.4x10$^{-11}$ s | $E_{e2-hh}$ = 1.36 eV |
| 4 | 12 ML GaAs$_{0.982}$N$_{0.018}$/GaAs to 3 ML GaAs$_{0.982}$N$_{0.018}$/GaAs | $E_{e2-hh}$ = 1.36 eV | Tunneling: $\tau_t$=1.5 x10$^{-15}$ s | $E_{e1-hh}$ = 1.35 eV |
| 5 | 3 ML GaAs$_{0.982}$N$_{0.018}$/GaAs | $E_{e1-hh}$ = 1.35 eV | Thermionic: $\tau_{th}$=2.5x10$^{-13}$ s | $Eg_{GaAs}$ = 1.42 eV |

THERMO-TUNNELING DESIGN FOR QUANTUM WELL PHOTOVOLTAIC CONVERTER

CROSS-REFERENCES TO RELATED APPLICATIONS

This application claims priority to U.S. Provisional Patent Application Ser. No. 61/586,020, entitled RESONANT THERMO-TUNNELING DESIGN FOR ULTRA-EFFICIENT NANOSTRUCTURED SOLAR CELLS, filed on Jan. 12, 2012, the entire content of which is hereby incorporated by reference.

FIELD OF THE INVENTION

The present invention relates generally to design of solar cells, and more specifically to design of the quantum well region of quantum well solar cells.

BACKGROUND

Since their introduction in early nineties [1] quantum well solar cells have shown great promise toward the realization of more efficient single junction and multi-junction devices [2-4].

In particular recent detailed balance calculations predict a 1-sun efficiency limit for a quantum photovoltaic cells of 44.5% [5], significantly higher than the Shockley-Queisser limit of ~31% for homo-junction cells [6]. Such analyses assume a complete collection of all photo-generated carriers.

Whereas for relatively shallow wells (<200 meV) experience shows that the thermoionic carrier escape rates approach unity [7], for deeper wells, needed for such realizations, thermionic escape times exceed typical recombination times and photo-generated carriers may largely recombine prior to escaping the well potential. Furthermore, under the scenario of an inefficient escape process, the incorporation of multiple quantum wells, necessary for sustaining a strong photo-absorption, would also affect detrimentally the collection of carriers that emanate from the base and the emitter of the device. The comparative advantage of extending the absorption spectrum of a solar cell towards the infra-red, through the inclusion of quantum confined structures, may then be completely suppressed due to a highly inefficient collection process.

Quantum mechanical tunneling and the thermally assisted quantum mechanical tunneling represent other possible escape mechanisms for carriers photo-created in the wells. For a typical device where a set of periodic quantum wells are inserted within the intrinsic (i) region of a p-i-n diode, a direct quantum mechanical tunneling of carriers out of the wells to the continuum (through field-induced barrier triangularization) would also require shallow confinements thereby once again restricting the use of deeper wells. Nevertheless, in theory, under a large bias this effect can be leveraged to make carriers resonantly cross several successive well potentials as long as the corresponding confinement energies are more or less aligned (within +/−kBT) at the operating conditions. Unfortunately, under operating conditions, the magnitude of the electric field across the i-region is weak and hence insufficient to favor an efficient direct tunneling.

An alternate to the direct carrier tunneling is the resonant thermo-tunneling where in a succession of well/barriers the carriers are thermally excited to higher confined levels and then resonantly coupled with a shallower confined state of adjacent wells until complete extraction to the continuum. A major difficulty in realizing such a quantum well staircase design for a solar cell device resides in the engineering of a structure where alignments of confined levels between adjacent levels occur simultaneously for both electrons and holes, an almost impossible task for most quantum well material systems that exhibit strong band discontinuities both for holes and electrons.

BRIEF DESCRIPTION OF THE DRAWINGS

FIG. 11: Energy levels of three $GaAs_{0.982}N_{0.018}/GaAs$ quantum wells with 30, 12 and 3 monolayers (1 ML~0.3 nm) at 300 K separated by 5 nm thick GaAs barriers. The escape sequence and corresponding transition types and characteristic times are also shown.

DETAILED DESCRIPTION

Figure 1:
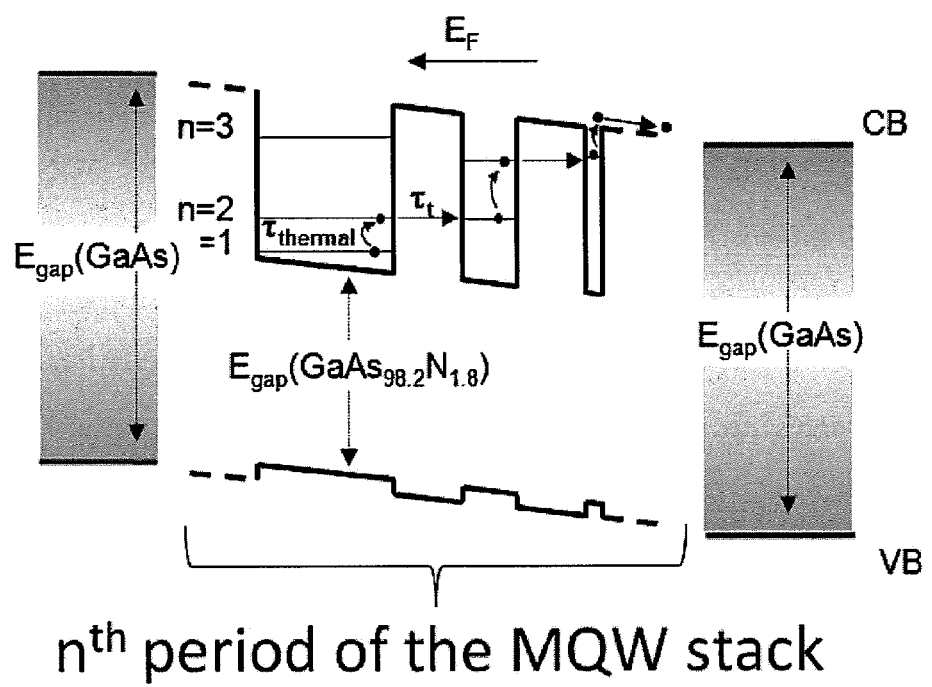
FIG. 1. Example in accordance with the present invention illustrating the thermo-tunneling quantum well region design using wells of three different thicknesses and possessing energy levels designed to facilitate electronic escape by leveraging on both thermionic and quantum tunneling mechanisms.

The present invention overcomes the challenges associated with quantum well solar cell design by implementing a thermo-tunneling design with material combinations that allow for deeper wells yet a very small band offset either at the conduction band (CB) or valence band (VB) level. III-V dilute nitride based quantum wells represent such material system since they exhibit very shallow (almost) negligible VB offsets. In such a structure, the escape of holes will be straightforward due to their shallow (<kBT, where kB is the Boltzmann constant and T the temperature in Kelvin) confinement and hence only the escape of electrons requires optimization.

The thinness of the inserted quantum wells circumvents the minority carrier diffusion length problems identified in bulk-like dilute nitrides while maintaining the unique properties of dilute nitrides (such as increased absorption) that are interesting for photovoltaic (PV) applications. This material system offers a wide range of available band gaps with energy values of high interest for PV application. The lattice matching possibility to readily available PV materials such as GaAs, Ge, InGaP also allows to avoid lattice relaxation/dislocations related issues. The observed increase in absorption coefficient with increasing N content [10, 11] and decreasing band gap [12-14] is a peculiar property of these materials that also makes them particularly interesting for PV [4, 15]. It allows for a higher number of confined states in each well and a stronger absorption with less material (fewer wells) [4, 16]. Implementing CB designs that enable easy electronic escape is therefore expected to result in a much wider photo-conversion range thus leading to significant photocurrent enhancements.

The invention discloses a practical energy level engineering design that significantly facilitates the collection of all photo-generated carriers, within several ps ($10^{-12}$ s). In a material system displaying a negligible valence band offset, which enables the smooth transport of holes, the conduction band confinement energies and barrier thicknesses can be designed to favor a sequential thermionic promotion and resonant tunneling of electrons to the conduction band continuum resulting in an overall faster carrier collection. Using 1 eV dilute nitride semiconductor quantum wells embedded in conventional GaAs solar cells (FIG. 1), we show that the incorporation of such thermo-tunneling design could lead to efficiencies exceeding the Shockley Queisser limit.

It should be noted that it is a common practice to incorporate small amounts of In in GaAs and its dilute nitride alloys when fabricating these devices on slightly mismatched substrates like Ge. Another common practice is the inclusion instead of GaAs of strain-compensated barriers (i.e. inclusion of elements like P, Al, Sb, Bi, In in the barrier material) in the quantum well region as described in the literature i.e. by Freundlich et al in U.S. Pat. No. 5,851,310. Finally it is also a common practice to include small amounts of In or Sb in the GaAsN. The embodiments described hereafter can be naturally expanded and/or adapted to these configurations by one skilled in the art.

In one embodiment the band structures of the electron, heavy hole and light hole energy levels, including strain and spin-orbit interaction, are calculated for the selected III-V material system. The calculation of the confinement energies of the electron, heavy hole and light hole and their corresponding excitonic transitions are also undertaken using the transfer matrix method [17, 18]. The solution of the related time independent Schrodinger equation is obtained by the imposition of boundary conditions. Once confinement energies and potential barrier heights for electrons and holes are determined, we complemented the theoretical evaluation by calculating electron escape times via a combination of thermionic and tunneling routes at 300 K.

The carrier loss rate for a carrier concentration C at a given energy subband (n) can be expressed as:

$$\frac{C}{\tau} = C\left(\frac{1}{\tau_{recomb}} + \frac{1}{\tau_{escape}}\right) = C\left(\frac{1}{\tau_{rad}} + \frac{1}{\tau_{non-rad}} + \frac{1}{\tau_t} + \frac{1}{\tau_{th}}\right) \quad (1)$$

Thus, the total number of carriers that escape the confining well without recombination can be given by:

$$\frac{C}{\tau_{escape}} = \frac{C}{\tau_t} + \frac{C}{\tau_{th}} \quad (2)$$

where $\tau_t$, the tunneling escape time for an arbitrary potential V(z), and $\tau_{th}$, the thermionic escape time, are given by [19-22]:

$$\frac{1}{\tau_t} = \frac{1}{W^2} \frac{\pi n \hbar}{2\pi m_w} \exp\left(-\frac{2}{\hbar}\int_0^b \sqrt{2m_b(qV(z) - E_n - qFz)}\, dz\right) \quad (3)$$

$$\frac{1}{\tau_{th}} = \frac{1}{W}\sqrt{\frac{kT}{2\pi m_w}} \exp\left(-\frac{E_{barr}(F)}{kT}\right) \quad (4)$$

where $m_w$ is the carrier effective mass in the quantum well, $m_b$ is the carrier effective mass in the barrier, W is the well width, b is the barrier width and $E_{barr}(F)$ is the barrier height for the $n^{th}$ energy subband. In the presence of an electric field F, the barrier height can be written as:

$$E_{barr}(F) = \Delta E_{C,V} - E_n - q\frac{FW}{2} \quad (5)$$

where $\Delta E_{C,V}$ is the conduction or valence band offset, $E_n$ the energy of the $n^{th}$ energy subband measured from the center of the well, and q the electron charge.

In another embodiment, using previously established methodology [3] to estimate the optical absorption of the quantum wells, and based on the drift-diffusion framework, we calculated the dark IV of the proposed quantum well solar cells in a single junction and multijunction configurations as well as their conventional counterpart.

Figure 2:
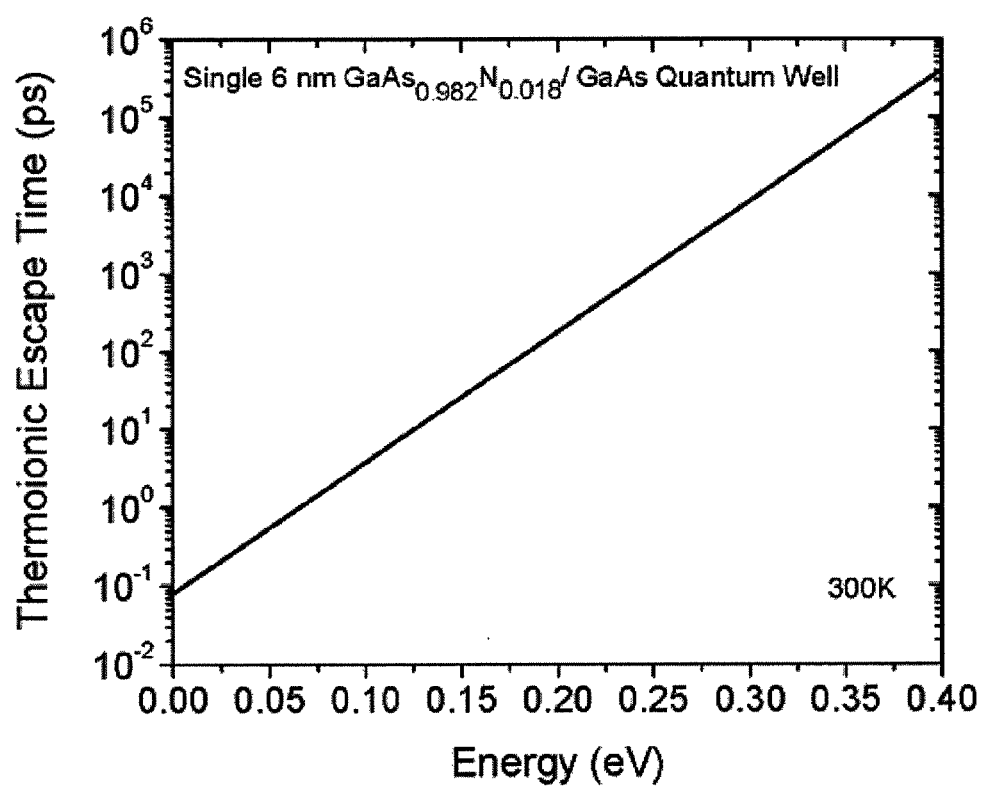
FIG. 2. Thermionic escape time vs. confined well depth for a 6 nm wide GaAsN/GaAs well.

We have also calculated the thermionic escape time of electrons from the various confined energy levels for a GaAsN/GaAs quantum well system. FIG. 2 shows that as the depth of the quantum well increases, the thermionic escape time increases exponentially. As an example, an escape from a 200 meV deep well leads to a thermionic escape time of 0.16 ns whereas, if we double that depth, the escape from 400 meV deep well leads to an extremely slow escape process with a related time of 0.37 µs, an increase by more than 200,000%.

FIG. 1 shows an example of a CB design that can be used to facilitate the extraction of electrons. The presence of a modest electric field (few kV/cm) under the solar cell operating conditions does not significantly alter the alignment calculated at flat band conditions. The thinness of the barrier between adjacent wells dictates that such movement is limited to few meV at most, well below the thermal energy at operation (~26 meV at 300 K). Such innovative structures are expected to facilitate the extraction and collection of both types of carriers, while at the same time extending the photon harnessing range of the device towards longer wavelengths, thereby increasing device performance. In order to quantify and offer a tangible example of such structure we have implemented a theoretical calculation of the CB of $GaAs_{0.982}N_{0.018}$/GaAs multi-quantum wells including associated transitions and electronic thermal and tunneling escape times. As an example, we consider a succession of three wells made of 11.2 nm, 5 nm and 1.7 nm thick of $GaAs_{0.982}N_{0.018}$ wells separated by 5 nm thick GaAs barriers. Details regarding energy levels involved and calculated carrier escape times are reported in table 1.

Figure 3:
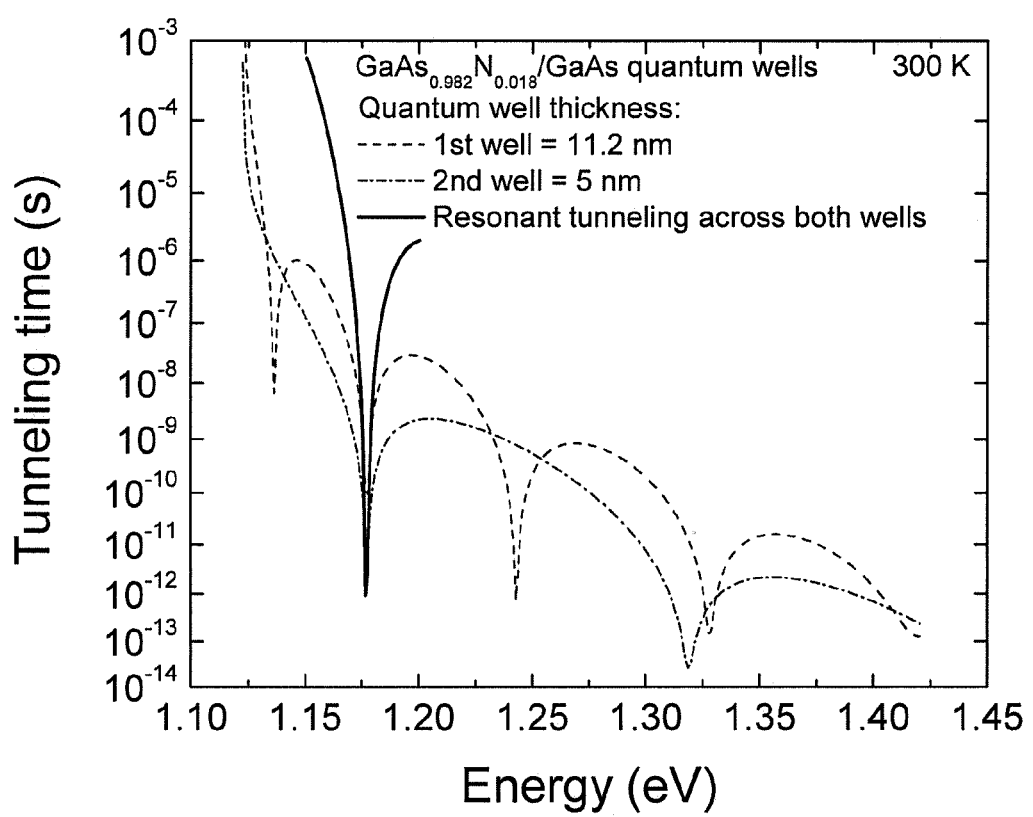
FIG. 3. Quantum Mechanical Tunneling calculation result from the $2^{nd}$ electron level of the $1^{st}$ 11.2 nm thick $GaAs_{0.982}N_{0.018}$ quantum well to the fundamental level of the $2^{nd}$ 5 nm thick $GaAs_{0.982}N_{0.018}$ quantum well. The two quantum wells are separated by 5 nm thick GaAs barrier. The calculation is done at 300 K for flat band condition (no electric field)

These wells were chosen because their calculated energy levels are aligned as shown in FIG. 2. In addition the valence band offset is negligible since its value is below the available thermal energy at operation. Each step of the 5 steps in the sequential escape process (FIG. 2) has been calculated (FIG. 3). These steps display the following characteristic escape times of: $6.5 \times 10^{-13}$ s, $9.3 \times 10^{-13}$ s, $14 \times 10^{-12}$ s, $3 \times 10^{-15}$ s and $7.9 \times 10^{-13}$ s, respectively.

The resonant tunneling times for various thickness combination of two consecutive $GaAs_{0.982}N_{0.018}$ wells separated by a 5 nm thick GaAs barrier was calculated (FIG. 3a) using the theoretical formalism described in section D. In addition, the tunneling calculation result the $2^{nd}$ electron level of the $1^{st}$ 11.2 nm thick $GaAs_{0.982}N_{0.018}$ quantum well to the fundamental level of the $2^{nd}$ 5 nm thick $GaAs_{0.982}N_{0.018}$ quantum well (first two wells shown in FIG. 2) is shown in FIG. 3b as an illustration of the tunneling calculation of the three well system chosen above. The two quantum wells are separated by 5 nm thick GaAs barrier. The calculation is done at 300 K for flat band condition (no electric field).

Such design is expected to lead to a boost in photocurrent thereby enabling an improvement in device performance while harvesting thermal energy that would have otherwise been wasted. Typical radiative recombination times $\tau_{recombination}$ are in the few hundreds of ps range; therefore escape times of several order of magnitude smaller than radiative recombination times should assure an efficient escape process. For a single quantum well an estimate of the internal quantum efficiency in given by $IQE_{QW}=1/\{1+(\tau_{escape}/\tau_{recombination})\}$, and the IQE for the multiquantum well system composed of N quantum wells is hence $IQE_{MQW}=(IQE_{QW})^N$. Using such formalism and previous experimental data on bias dependant spectral response analysis [16] we have estimated the IQE for 15 period MQW to be ~0.5 (~0.95 for a single well) and yielding a recombination time of about 0.1 ns. Taking into account the faster escape times afforded by the present design, we can estimate an IQE for a single 3 well coupled system as presented above to be 0.998 leading to almost negligible carrier collection losses.

Figure 4:
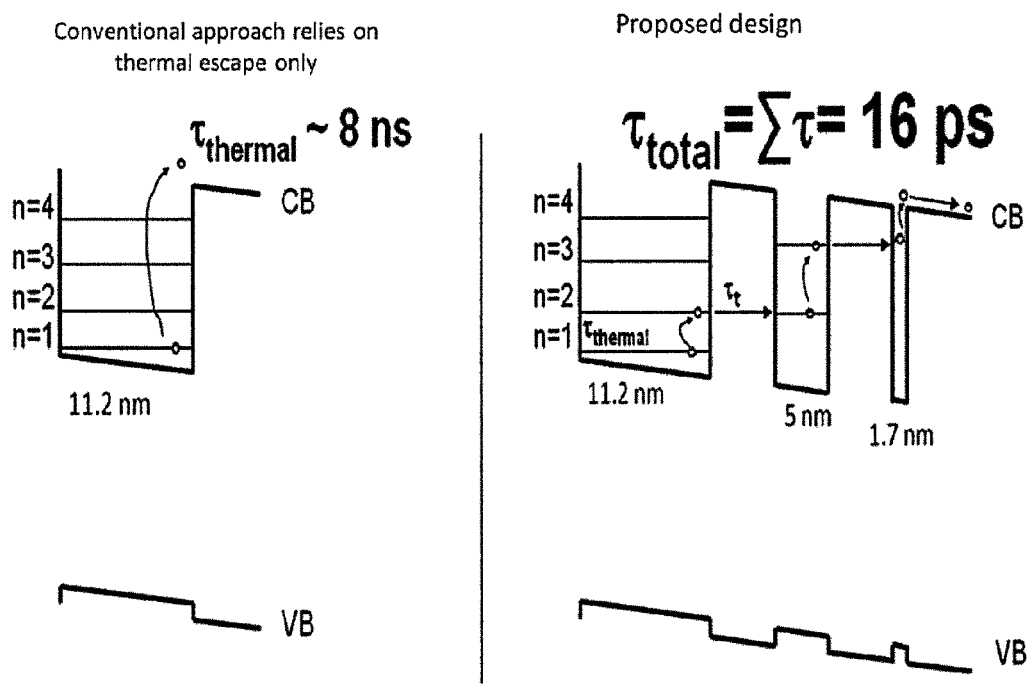
FIG. 4. Schematic diagrams showing the escape process and time for the conventional deep well quantum well (left) and the design in accordance with the present invention for a faster escape.
Figure 5:
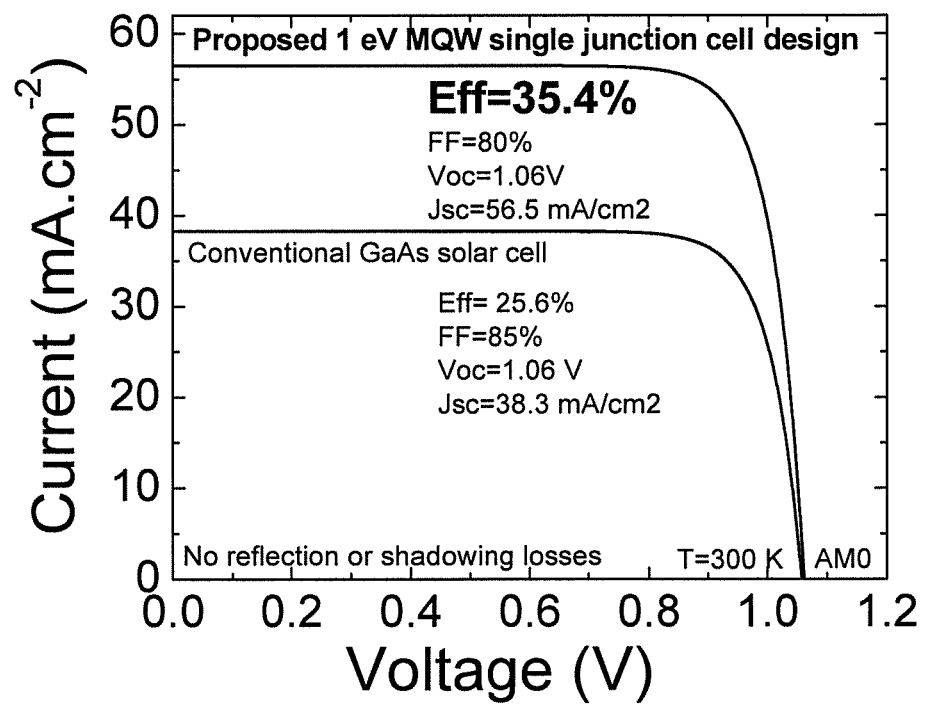
FIG. 5. Calculated current vs. voltage characteristic for a conventional GaAs and the 20 period 1 eV MQW of the present invention embedded in GaAs p-i-n solar cell at AM0. Each period contains 3 wells of 11.2, 5 and 1.7 nm separated by 5 nm GaAs, and each period is separated from adjacent periods by 20 nm GaAs. The calculation is made using the realistic drift-diffusion framework for both devices. The dark current was derived for both devices, and experimental material and device parameters extracted from past experiments and the literature have been used. The carrier escape probability is assumed to be equal to unity due to the very fast thermo-tunneling escape times obtained. Note that the expected efficiency of the latter surpasses the Shockley-Queisser efficiency limit.
Figure 6:
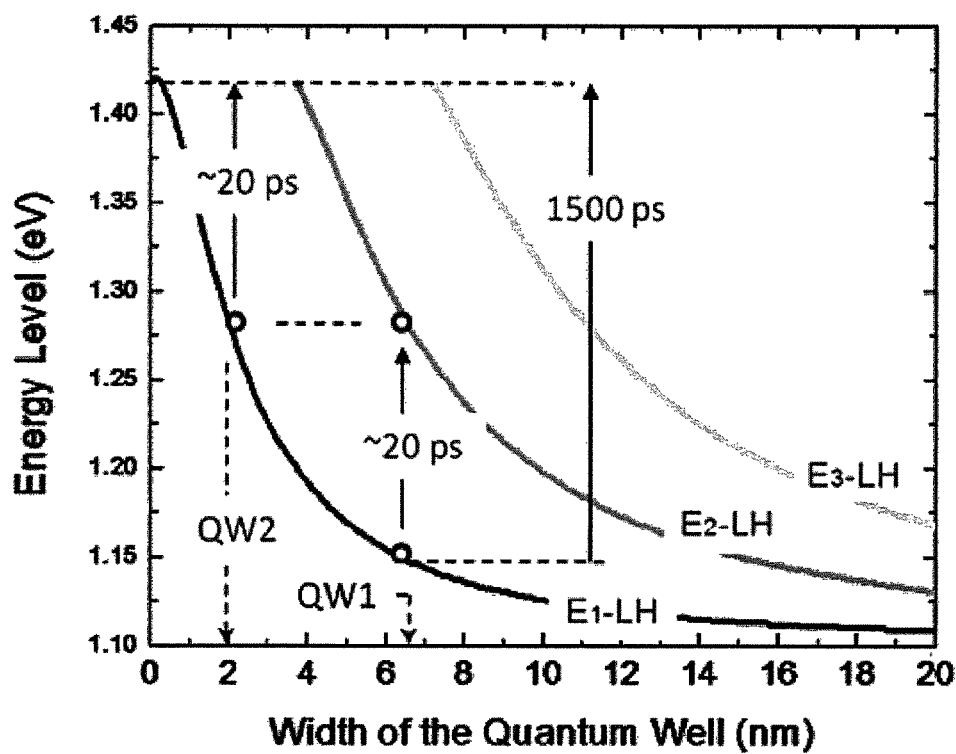
FIG. 6. Evolution of the fundamental confined transition energy of the quantum well ($m_j = \pm\frac{1}{2}$ hole level to $1^{st}$ electron level) for $GaAs_{0.98}N_{0.02}$, on GaAs as a function of well width.
Figure 7:
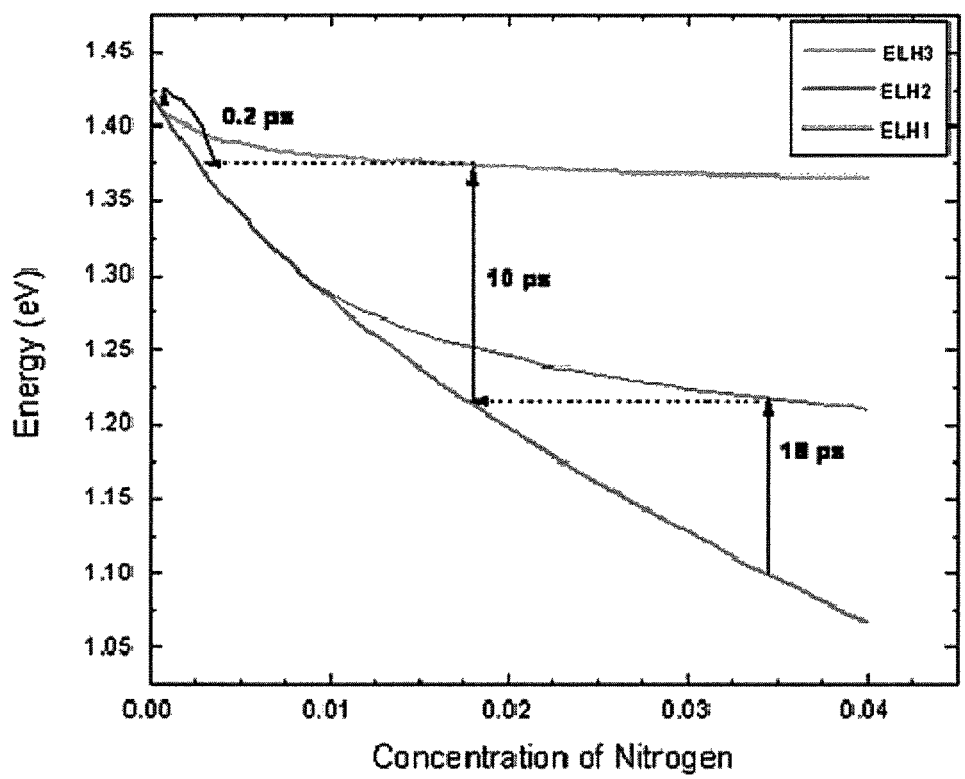
FIG. 7. Evolution of the fundamental confined transition energy of the quantum well ($m_j = \pm\frac{1}{2}$ hole level to $1^{st}$ electron level) for GaAsN on GaAs as a function of nitrogen composition for a 6 nm well.
Figure 8:
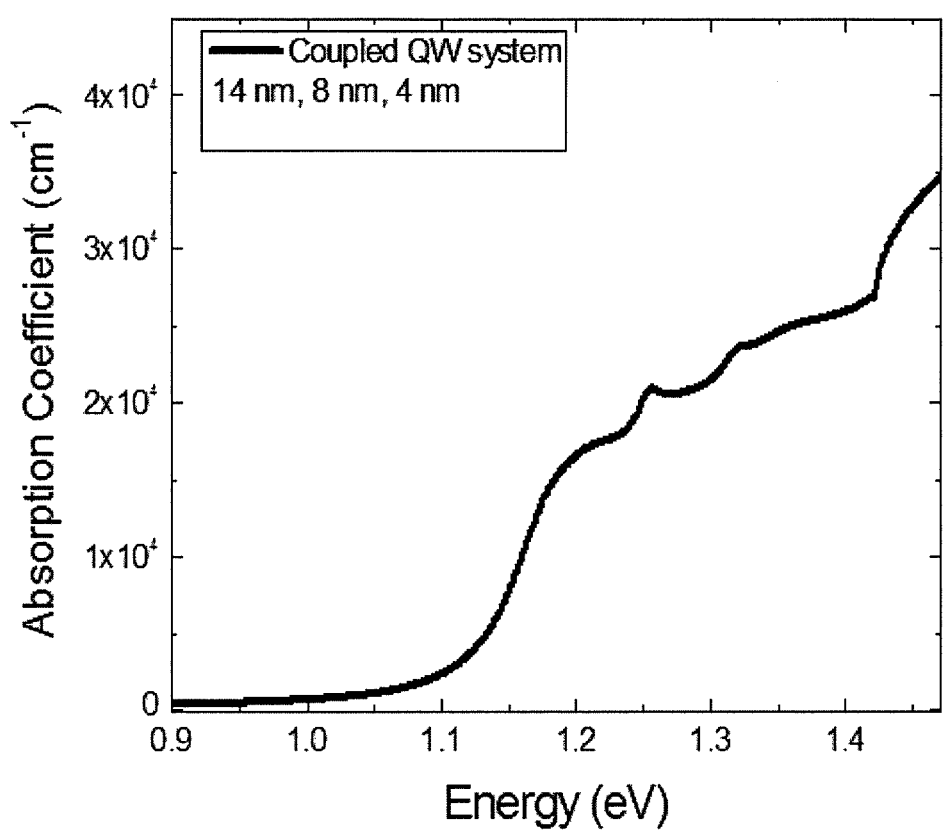
FIG. 8. Calculated absorption coefficient of a coupled quantum well system fabricated with 3 wells separated by 5 nm barriers.

The calculated current vs voltage characteristics for a conventional GaAs solar cell and the proposed 1 eV GaAsN/GaAs multi-quantum well (MQW) GaAs p-i-n solar cell are shown in FIG. 5 (at AM0). An example of selection of the well depths as a function of the nitrogen content in the well or the well thickness are shown in FIG. 6. We show an example of the calculation of the absorption coefficient for one period composed of 3 coupled quantum wells is shown in FIG. 8. The calculation of the IV characteristics of single junction solar cells is based on the realistic drift-diffusion framework that uses experimental material and device parameters extracted from past experiments and the literature. Based on the fast escape times obtained (FIG. 4) we have assumed a thermo-tunneling electron escape probability equal to unity (0.97) for the device incorporating 20 period of 1 eV coupled QWs in the intrinsic region of a GaAs p-i-n solar cell calculated in FIG. 5. Should be noted that here the fast collection of carriers is expected to prevent recombination losses that would otherwise degrade both the Voc and photo-conversion efficiency as seen in conventional MQW solar cells. Electrons are using available thermal energy to be promoted to a higher energy level in each quantum well. The harvesting of otherwise wasted thermal energy enables the implementation of such thermo-tunneling design. It is therefore expected to have a cooling effect on the device, through the conversion of heat into electrical energy, which is a key feature for concentrator application. Assuming such efficient carrier escape process, and using the drift-diffusion framework, the 1 eV MQWs are expected to add about 18 mA/cm² of short circuit current to the GaAs photocurrent baseline, while maintaining the open circuit voltage (Voc) [4]. The details of the calculation of the contribution of dilute nitride quantum wells, behind a GaAs cell, are reported elsewhere in reference 3. The overall close to 40% improvement in conversion efficiency (from 25.6 to 35.4%) shows that such design enables single junction solar cells to overcome the limitation of their bulk counterparts. This somewhat practically realizable device, yields efficiencies that are in accord with prior detailed balance projections and suggest potential of the proposed approach to significantly exceed the Shockley-Queisser efficiency limits.

Figure 9:
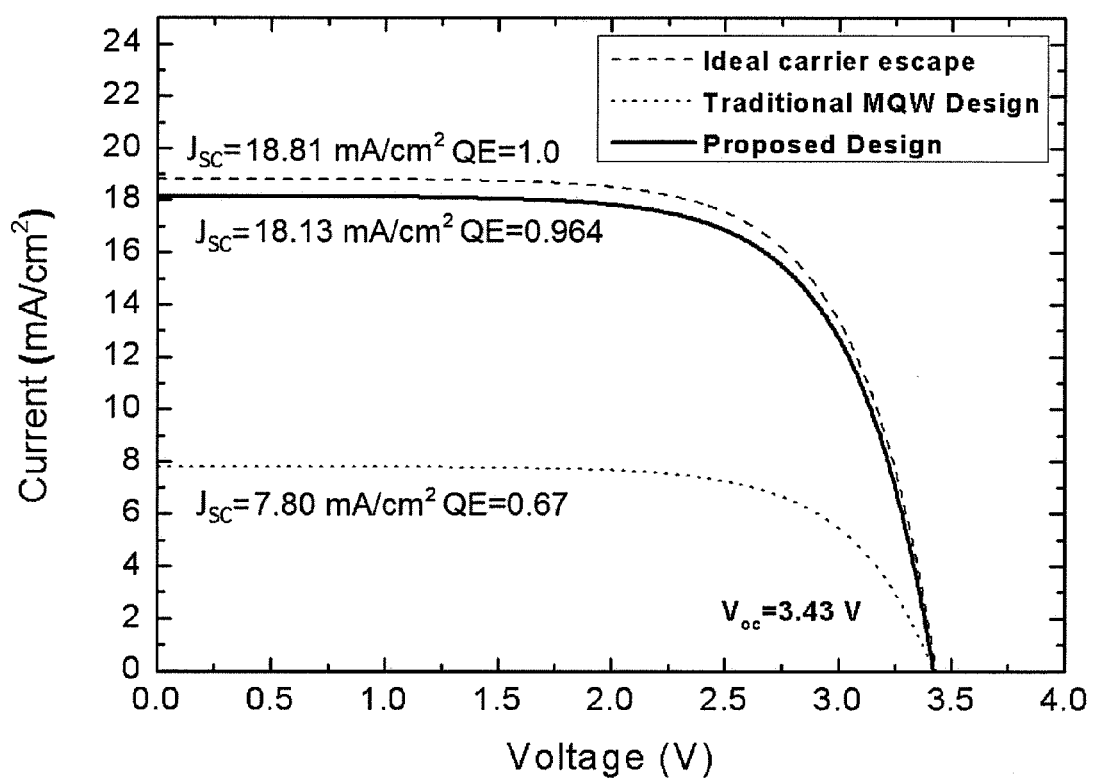
FIG. 9. Calculated IV characteristics of a 4-junction solar cell using 20 periods of the proposed MQW design (IQE=0.967). Results are compared to the ideal efficiency limit and to that with conventional quantum wells (IQE=0.47)
Figure 10:
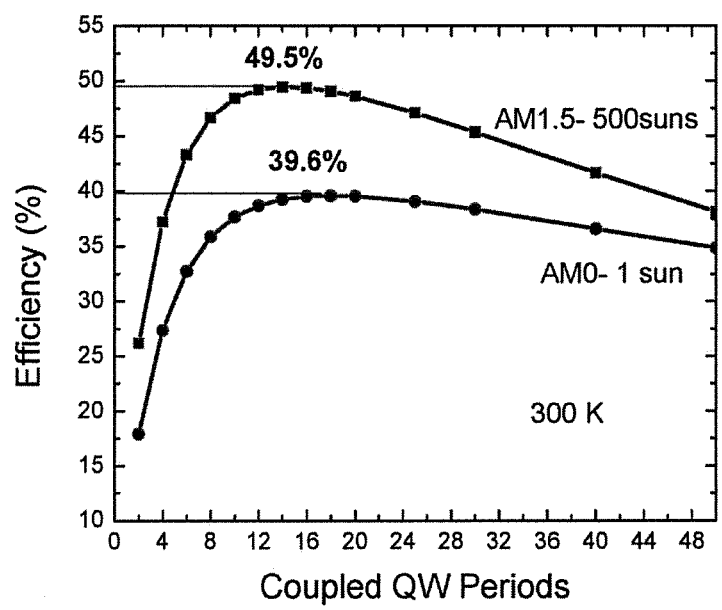
FIG. 10. Efficiency vs. number of periods of coupled quantum wells using experimentally determined GaAsN absorption coefficient for a p/n InGaP (1.8 eV, 2.3 micron), p-i-n MQW GaAs/GaAsN (1.1 eV, 5.3 microns+i-region) and Ge (0.66 eV, 3.3 microns) triple junction solar cell with quasi-ideal diffusion lengths. A Out 2% reflection loss is considered for the entire range of the spectrum. The calculation is implemented for 1 sun AM0 (sunlight in outer earth atmosphere) and 500 sun concentration under AM1 illumination.

In another example we have calculated the IV characteristics for a 4 junction solar cell similar to the one proposed in reference 4 and where instead of conventional quantum wells, the proposed design is used. The IV characteristics of such device is shown in FIG. 9, showing the expected current output improvement when compared to a device made with conventional quantum wells. In FIG. 10 we provide the evolution of the efficiency the 4 junction well as a function of the numbers of coupled quantum wells of 12, 5 and 2 nm (separated by tunneling barriers of 5 nm), the barrier thickness between the coupled wells is 20 nm. The results suggest that the devices can reach efficiencies in excess of 39% under 1 sun AM0 illumination and 49% under concentration of 500.

CONCLUSION

An innovative energy level engineering design that reduces carrier escape times in MQW solar cells by three orders of magnitude is presented. The possibility of 1 eV MQW single junction solar cell with practical conversion efficiency in excess of 35% at AM0 is shown. Also as shown here, resonant thermo-tunneling designs may allow for high performance single junction MQW solar cells with substantially improved efficiencies, well beyond the efficiency limit of conventional single junction solar cells. In short, the suggested device design is expected to circumvent recombination losses and lead to substantial carrier collection and photovoltaic efficiency improvements. The Design is also evaluated within the context of multijunction devices.

While the invention described here specifically focuses on a novel method to design and fabricate 0.9-1.1 eV solar cells using GaAsN epilayers with bandgaps in the desired range for the above mentioned single junction and multi-junction solar cell design, one of ordinary skills in the art, with the benefit of this disclosure, would recognize the extension of the approach to other types of quantum well solar cells.

The present invention is well adapted to attain the ends and advantages mentioned as well as those that are inherent therein. The particular embodiments disclosed above are illustrative only, as the present invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular illustrative embodiments disclosed above may be altered or modified and all such variations are considered within the scope and spirit of the present invention. Also, the terms in the claims have their plain, ordinary meaning unless otherwise explicitly and clearly defined by the patentee.

REFERENCES

[1] K. W. J. Barnham and G. Duggan, "A new approach to high-efficiency multi-band-gap solar cells", *J. Appl. Phys.* 67, 7, 3490-3493 (1990)

[2] Freundlich A. "Multi-quantum well tandem solar cell", U.S. Pat. No. 6,372,980 (2002)

[3] A. Freundlich and A. Alemu, "Multi quantum well multijunction solar cell for space applications", *physica status solidi (c)*, Vol. 2 (8), pp 2978-2981 (2005)

[4] G. K. Vijaya, A. Alemu, and A. Freundlich, "Modeling of 1 ev dilute nitride multi-quantum well solar cell", *Proceedings of the 35th IEEE Photovoltaic Specialists Conference*, Honolulu, Hi. (2010) pp 380-384

[5] G. Wei, K. T. Shiu, N. C. Giebink and S. R. Forresta, "Thermodynamic limits of quantum photovoltaic cell efficiency", *Appl. Phys. Lett.* 91, 223507 (2007)

[6] W. Shockley and H. J. Queisser, "Detailed Balance Limit of Efficiency of p-n Junction Solar Cells", *J. Appl. Phys.*, 32, pp. 510-519 (1961)

[7] C. Monier, M F Vilela, I. Serdiukova, and A. Freundlich "Photocurrent and photoluminescence spectroscopy of $InAs_xP_{1-x}$/InP strained quantum wells grown by chemical beam epitaxy", J. Cryst. Growth, 188 pp. 332-337 (1998)

[8] A. Freundlich, A. Fotkatzikis, L. Bhusal, L. Williams, A. Alemu, W. Zhu, J. A. H. Coaquira, A. Feltrin and G. Radhakrishnan, "III-V dilute nitride-based multi-quantum well solar cell", *Journal of Crystal Growth*, Volumes 301-302, pp 993-996 (2007)

[9] A. Alemu and A. Freundlich, "Opportunities in dilute nitride III-V semiconductors quantum confined p-i-n solar cells for single carrier resonant tunneling", *Microelectron. J.*, Volume 40, Issue 3, 421-423 (2009)

[10] L. Bhusal, A. Freundlich "Band structure and absorption properties of $GaAs_{1-x}N_x$/$InAs_{1-y}N_y$ short period superlattices strained to InP (001)"*Phys. Rev. B* 75, 075321 (2007)

[11] S. Turcotte, J.-N. Beaudry, R. A. Masut, P. Desjardins, G. Bentoumi, and R. Leonelli, "Experimental investigation of the variation of the absorption coefficient with nitrogen content in GaAsN and GaInAsN grown on GaAs (001)", *J. Appl. Phys.*, 104, 083511 (2008)

M. Weyers and M. Sato. "Growth of GaAsN alloys by low-pressure metalorganic chemical vapor deposition using plasma-cracked NH3 ", *J. Appl. Phys. Lett.* 62 (12), pp. 1396 (1993)

[13] W. Shan, W. Walukiewicz, and J. W. Ager, III, "Band Anticrossing in GaInNAs Alloys", *Phys. Rev. Lett.* 82, 1221-1224 (1999)

[14] J. A. H. Coaquira, M.-A. Pinault, A. P. Litvinchuk, L. Bhusal and A. Freundlich, "Near band-edge luminescence and evidence of the weakening of the N coupling for high nitrogen composition in $GaAs_{1-x}N_x$ diluted nitride epilayers."*J. Appl. Phys.* 102, 073716 (2007)

[15] S. R. Kurtz, A. A. Allerman, E. D. Jones, J. M. Gee, J. J. Banas, "InGaAsN solar cells with 1.0 eV band gap, lattice matched to GaAs", *Appl. Phys. Lett.*, Vol. 74, pp. 729-731 (1999)

[16] A. Freundlich, A. Fotkatzikis, L. Bhusal, L. Williams, A. Alemu, W. Zhu, J. A. H. Coaquira, A. Feltrin, and G. Radhakrishnan, "Chemical beam epitaxy of GaAsN/GaAs multiquantum well solar cell", *Vac. Sci. Technol. B* 25, 987 (2007)

[17] L. Bhusal, A. Alemu, A. Freundlich. "Band alignments and quantum confinement in (111) GaAsN/InAs strain-balanced nanostructures", Nanotechnology 15, S245-S249 (2004).

[18] L. Bhusal. A. Alemu, A. Freundlich "Short-period strain-balanced $GaAs_{1-x}N_x$/$InAs_{1-x}N_x$ superlattices lattice matched to InP(001): A material for 0.4-0.6 eV mid infrared applications", Phys Rev B, 72, 073309 (2005)

[19] Schneider H. and Klitzing K. v., "Thermionic emission and Gaussian transport of holes in a $GaAs/Al_xGa_{1-x}$ As multiple-quantum-well structure", *Phys. Rev. B* 38, 6160 (1988)

[20] Fox A. M., Miller D. A. B., Livescu G., Cunningham J. E. and Jan W. Y., "Quantum well carrier sweep out: relation to electroabsorption and exciton saturation", *IEEE Journal of Quantum Electronics*, 27, 2281 (1991)

[21] Larsson A., Andrekson P. A., Eng S. T. and Yariv A., "Tunable superlattice p-i-n photodetectors: characteristics, theory, and application", *IEEE Journal of Quantum Electronics*, 24, 787 (1988)

[22] Raisky O. Y., Wang W. B., Alfano R. R., Reynolds C. L. Jr. and Svvaminathana V., "Investigation of photoluminescence and photocurrent in InGaAsP/InP strained multiple quantum well heterostructures", *J. Appl. Phys.* 81, 394 (1997)

The invention claimed is:

1. A multi-quantum well solar cell comprising:
   a plurality of quantum wells incorporated into the intrinsic region of a GaAs p-i-n solar cell;
   wherein the plurality of quantum wells comprises at least a first quantum well and an adjacent quantum well;
   wherein the adjacent quantum well is designed to have a reduces thickness or a reduced nitrogen content compared to the first quantum well, whereby an energy of an excited state of the first quantum well is resonantly coupled with a shallower confined energy state of the adjacent quantum well, and wherein electron escape is facilitated from the first quantum well to a higher energy level in the adjacent quantum well using both thermoionic and quantum tunneling.

2. The multi-quantum well solar cell of claim 1, wherein the conversion efficiency of the solar cell is in excess of 35% at AM0.

3. The multi-quantum well solar cell of claim 1, wherein collection of photo-generated carriers occurs within 0.1 to 10 ps.

4. A multi-quantum well solar cell comprising:
two or more identical subsets of resonantly coupled quantum wells incorporated into the intrinsic region of a GaAs p-i-n solar cell;
wherein each subset of resonantly coupled quantum wells comprises a first quantum well consisting of 30 monolayers of $GaAs_{0.982}N_{0.018}$, a second quantum well consisting of 12 monolayers of $GaAs_{0.982}N_{0.018}$, and a third quantum well consisting of 3 monolayers of $GaAs_{0.982}N_{0.018}$;
wherein the first quantum well is adjacent to the second quantum well, wherein the first quantum well and the second quantum well are designed such that the second quantum well has a reduced thickness or a reduced nitrogen content compared to the first quantum well, whereby an energy of an excited state of the first quantum well is resonantly coupled with a shallower confined energy state of the second quantum well;
wherein the second quantum well is adjacent to the third quantum well, wherein the second quantum well and the third quantum well are designed such that the third quantum well has a reduced thickness or a reduces nitrogen content compared to the second quantum well, whereby an energy of an excited state of the second quantum well is resonantly coupled with a shallower confined energy state of the third quantum well; and
wherein the first, second, and third quantum wells are separated by a GaAs barrier.

5. The multi-quantum well solar cell of claim 4, wherein the first quantum well is approximately 11.2 nm thick.

6. The multi-quantum well solar cell of claim 4, wherein the second quantum well is approximately 5 nm thick.

7. The multi-quantum well solar cell of claim 4, wherein the third quantum well is approximately 1.7 nm thick.

8. The multi-quantum well solar cell of claim 4, wherein the GaAs barrier is approximately 5 nm thick.

9. The multi-quantum well solar cell of claim 1, wherein two or more subsets of pluralities of resonantly coupled quantum wells are incorporated into the intrinsic region of the GaAs p-i-n solar cell.

10. A p-i-n solar cell comprising:
a plurality of quantum wells incorporated into the intrinsic region of the solar cell, wherein the plurality of quantum wells comprises at least a first quantum well and an adjacent quantum well, wherein the first quantum well and the adjacent quantum well are designed such that an energy of an excited state of the first quantum well is resonantly coupled with a shallower confined energy state of the adjacent quantum well, and wherein electron escape is facilitated from the first quantum well to a higher energy level in the adjacent quantum well using both thermoionic and quantum tunneling.

11. The p-i-n solar cell of claim 10, wherein the conversion efficiency of the solar is in excess of 35% at AM0.

12. The p-i-n solar cell of claim 10, wherein collection of photo-generated carriers occurs within 0.1 to 10 ps.

13. The p-i-n solar cell of claim 10, wherein two or more subsets of pluralities of resonantly coupled quantum wells are incorporated into the intrinsic region of the p-i-n solar cell.

14. The p-i-n solar cell of claim 10, wherein two or more identical subsets of pluralities of resonantly coupled quantum wells are incorporated into the intrinsic region of the p-i-n solar cell.

15. The p-i-n solar cell of claim 10, wherein two or more identical subsets of pluralities of resonantly coupled quantum wells are incorporated into the intrinsic region of a GaAs p-i-n solar cell, wherein each subset comprises a first quantum well consisting of 30 monolayers of $GaAs_{0.982}N_{0.018}$, a second quantum well consisting of 12 monolayers of $GaAs_{0.982}N_{0.018}$, and a third quantum well consisting of 3 monolayers of $GaAs_{0.982}N_{0.018}$, and wherein the first, second, and third quantum wells are separated by a GaAs barrier.

16. The p-i-n solar cell of claim 15, wherein the GaAs barrier is approximately 5 nm thick.

17. A multi-junction solar cell comprising two or more subcells, wherein one or more subcells comprises the p-i-n solar cell of claim 10.

* * * * *